United States Patent
Yoshida et al.

(10) Patent No.: US 9,073,308 B2
(45) Date of Patent: Jul. 7, 2015

(54) PIEZOELECTRIC ELEMENT, INKJET DEVICE USING SAME, AND APPLICATION METHOD THEREOF

(71) Applicant: Panasonic Corporation, Kadoma-shi, Osaka (JP)

(72) Inventors: Hidehiro Yoshida, Osaka (JP); Teiichi Kimura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/353,397

(22) PCT Filed: Apr. 15, 2013

(86) PCT No.: PCT/JP2013/002533
§ 371 (c)(1),
(2) Date: Apr. 22, 2014

(87) PCT Pub. No.: WO2013/171972
PCT Pub. Date: Nov. 21, 2013

(65) Prior Publication Data
US 2014/0267507 A1    Sep. 18, 2014

(30) Foreign Application Priority Data
May 17, 2012  (JP) ................................ 2012-113268

(51) Int. Cl.
*B41J 2/045* (2006.01)
*B41J 2/14* (2006.01)
(Continued)

(52) U.S. Cl.
CPC .............. *B41J 2/045* (2013.01); *B41J 2/14209* (2013.01); *B41J 2/14201* (2013.01);
(Continued)

(58) Field of Classification Search
CPC ...... B41J 2/14233; B41J 2/1623; B41J 2/161; B41J 2002/14491; B41J 2002/14419; B41J 2/14209; B41J 2/1609; B41J 2/1632; B41J 2/1646; B41J 2002/14225; B41J 2002/14217; B41J 2/14274; B41J 2/14201; H01L 41/047; H01L 41/083; H01L 41/0926; H01L 41/39; H01L 41/107; H01L 41/0472; H03H 9/132; H03H 9/19
See application file for complete search history.

(56) References Cited

U.S. PATENT DOCUMENTS

| 6,140,749 A * | 10/2000 | Nakatani ...................... 310/366 |
| 6,943,483 B2 * | 9/2005 | Takeuchi et al. .............. 310/328 |
| 2002/0003386 A1 * | 1/2002 | Kitahara ....................... 310/366 |

FOREIGN PATENT DOCUMENTS

| JP | H11-320881 | 11/1999 |
| JP | 2002-316411 | 10/2002 |

(Continued)

*Primary Examiner* — Geoffrey Mruk
(74) *Attorney, Agent, or Firm* — Hamre, Schumann, Mueller & Larson, P.C.

(57) ABSTRACT

The piezoelectric element includes first and second sheets 30 and 40 that are stacked and burned. In this stacked state, a second electrode 60 is located on a first long side 30*a* having a first non-electrode region 51. Thus, before a conductive film 100A is formed, the end face of a first electrode 50 and the end face of the second electrode 60 are exposed on lateral surfaces 20*b* and 20*d* on the same side and can be observed thereon. Slits 91 are formed at certain intervals in a lengthwise direction X. The conductive film 100A is formed so as to apply a voltage between the second electrode 60 exposed on a front surface 20*a* and ends 20*ab* and 20*ad*, thereby driving the piezoelectric element only with connection from the front surface 20*a*.

12 Claims, 10 Drawing Sheets

(51) Int. Cl.
    *H01L 41/293* (2013.01)
    *H01L 41/297* (2013.01)
    *H01L 41/273* (2013.01)
    *H01L 41/338* (2013.01)
    *B41J 2/16* (2006.01)
    *H01L 41/083* (2006.01)

(52) U.S. Cl.
    CPC .... *B41J 2002/14217* (2013.01); *H01L 41/293* (2013.01); *H01L 41/297* (2013.01); *H01L 41/273* (2013.01); *H01L 41/338* (2013.01); *B41J 2/1607* (2013.01); *H01L 41/083* (2013.01); *B41J 2002/14491* (2013.01); *B41J 2202/11* (2013.01)

(56) References Cited

FOREIGN PATENT DOCUMENTS

| | | |
|---|---|---|
| JP | 2010-62196 | 3/2010 |
| JP | 2010-245513 | 10/2010 |
| JP | 2012-178462 | 9/2012 |

* cited by examiner

PIEZOELECTRIC ELEMENT, INKJET DEVICE USING SAME, AND APPLICATION METHOD THEREOF

TECHNICAL FIELD

The present invention relates to a piezoelectric element, an inkjet device using the same, and a method thereof.

BACKGROUND ART

In recent years, attention has focused on methods for manufacturing electronic devices by ink-jet technology.

According to a piezoelectric element in Patent Literature 1, electrodes provided on two ends along a short side of the piezoelectric element can be removed from one side of the piezoelectric element. The structure will be discussed below.

FIG. 7(a) is a plan view of a first ceramic green sheet 30. FIG. 7(b) is a plan view of a second ceramic green sheet 40. Hereinafter, the first ceramic green sheet 30 will be called a first sheet and the second ceramic green sheet 40 will be called a second sheet.

In the conventional piezoelectric element, as shown in FIG. 8, the first sheets 30 and the second sheets 40 are stacked on a lower part 90, and then are pressed and burned thereon.

A first electrode 50 of conductive paste is formed on the first sheet 30. A second electrode 60 is formed on the second sheet 40. The first electrode 50 has a first non-electrode region 51 and the second electrode 60 has a second non-electrode region 61.

The first and second sheets 30 and 40 are stacked, pressed, and burned so as to obtain a block 20 as an intermediate product shown in FIG. 8(a). FIG. 8(a) is a perspective view of the block 20. The front surface will be called a front surface 20a, the rear surface will be called a rear surface 20c, the right lateral surface will be called a right lateral surface 20b, and the left lateral surface will be called a left lateral surface 20d.

The first electrodes 50 are exposed only on the front surface 20a of the piezoelectric element 20 but are not exposed on the right lateral surface 20b, the left lateral surface 20d, and the rear surface 20c of the piezoelectric element 20.

The second electrodes 60 are exposed on the rear surface 20c but are not exposed on the front surface 20a, the right lateral surface 20b, and the left lateral surface 20d. Connection electrodes 70 are exposed on the front surface 20a, the right lateral surface 20b, and the rear surface 20c of the piezoelectric element. In other words, the connection electrodes 70 are formed up to the front surface 20a and the rear surface 20c of the piezoelectric element 20 that are opposed to each other.

FIG. 8(b) shows the rear surface 20c of the piezoelectric element 20. The connection electrodes 70, the second electrodes 60, and the second non-electrode region 61 are shown on the front surface.

As shown in FIG. 8(c), a conductive layer 100 is formed over the rear surface 20c and requires more piezoelectric elements. As shown in FIG. 9, a plurality of slits 91 are formed so as to constitute the piezoelectric element 20.

The piezoelectric element 20 includes the connection electrodes 70 and the second electrodes 60 that are electrically connected to each other on the rear surface 20c via the conductive layer 100. Thus, the first electrodes 50 and the connection electrodes 70 are connected to external electrodes on the front surface 20a, activating a piezoelectric substance. Hence, external connection can be made only on one of the surfaces of the piezoelectric element 20. The surface is connected to a substrate having a number of external connection electrodes, thereby driving the piezoelectric elements. The piezoelectric element 20 used for an inkjet requires quite a number of piezoelectric substances, and a plurality of external electrodes need to be removed from one of the surfaces (front surface 20a) of the piezoelectric element 20.

FIGS. 10(a) to 10(c) show displacements when a voltage is applied to the piezoelectric element 20. Specifically, an upper view shows a cross section of the piezoelectric element 20 while a lower view shows a displacement in this state. In this case, the cross section is perpendicular to the front surface 20a and the rear surface 20c of the piezoelectric element 20 in FIG. 8.

In FIG. 10(a), symmetric displacements appear when $d1=d2$ is satisfied where $d2$ and $d1$ are the widths of the second non-electrode region 61 and the first non-electrode region 51 on the two ends of the piezoelectric element 20.

As shown in FIG. 10(b), when "$d1>d2$" is satisfied, the displacement of the smaller $d2$ is larger than that of the larger $d1$. As shown in FIG. 10(c), when "$d1<d2$" is satisfied, the displacement of the smaller $d1$ is larger than that of the larger $d2$.

As described earlier, the locations of the maximum displacement of the piezoelectric element 20 vary depending upon the widths $d1$ and $d2$ of the non-electrode regions 51 and 61. In other words, the maximum displacement position and the maximum displacement of the piezoelectric element 20 vary depending upon the values of the widths of the non-electrode regions.

The values of the widths of the non-electrode regions vary because of the forming accuracy of the formed electrodes, a displacement when the ceramic green sheet is stacked, the degree of shrinkage during burning, and so on.

CITATION LIST

Patent Literature

Patent Literature 1: Japanese Patent Laid-Open No. 11-320881

SUMMARY OF INVENTION

Technical Problem

In response to future electronic devices having higher densities, the displacement and the displacement position of the piezoelectric element 20 during the application of a voltage need to be accurately controlled.

For this purpose, the electrodes for external connection need to be removed from one of the surfaces of the piezoelectric element 20 and the widths of the non-electrode regions need to be inspected before assembly.

In the conventional configuration, as shown in FIGS. 7 and 8, the regions of the non-electrode regions 51 and 61 are located in three directions but are exposed only on one side, so that only a part of the non-electrode regions 51 and 61 can be confirmed. Thus, as shown in FIG. 10, the maximum displacement of the piezoelectric element 20 cannot be located by the widths of the non-electrode regions. This leads to variations in the ejection volume of an ink-jet head that uses the piezoelectric element 20.

The present invention has been devised to solve the conventional problems. An object of the present invention is to provide a structure that can confirm the width of a non-electrode region and remove electrodes from one surface of a piezoelectric element.

Solution to Problem

In order to attain the object, a piezoelectric element of the present invention is a piezoelectric element that is a block of a rectangular solid, the block including: a first sheet with a rectangular principal surface having a first short side, a second short side, a first long side, and a second long side, the principal surface including a first electrode formed up to at least only a part of the first short side and up to only the second long side; and a second sheet with a rectangular principal surface having a third short side, a fourth short side, a third long side, and a fourth long side, the principal surface including a second electrode formed up to at least only a part of the third short side and up to only the third long side, the sheets being stacked such that the first long side and the third long side are aligned with each other and the first short side and the third short side are aligned with each other with the principal surfaces placed face up or face down, the block further including: a plurality of slits that are formed perpendicularly to the first long side and are spaced at predetermined intervals along the first long side of the block; and a conductive film electrically connecting: a surface including the second long side of the block; at least one of two ends along the first long side on a surface including the first long side of the block; and a surface including the first short side and the third short side of the block.

A piezoelectric element of the present invention is a piezoelectric element that is a block of a rectangular solid, the block including: a first sheet with a rectangular principal surface having a first short side, a second short side, a first long side, and a second long side, the principal surface including a first electrode formed up to at least only a part of the first short side and up to only the second long side; and a second sheet with a rectangular principal surface having a third short side, a fourth short side, a third long side, and a fourth long side, the principal surface including a second electrode formed up to at least only a part of the third short side and up to only the third long side, the sheets being stacked such that the first long side and the third long side are aligned with each other and the first short side and the third short side are aligned with each other with the principal surfaces placed face up or face down, the block further including: a plurality of slits that are formed perpendicularly to the first long side and are spaced at predetermined intervals along the first long side of the block; and a conductive film electrically connecting: a surface including the second long side of the block; at least one of two ends along the first long side on a surface including the first long side of the block; and one of the top surface and the bottom of the block.

Advantageous Effects of Invention

According to the present invention, a surface observation on a stacked and burned ceramic green sheet allows confirmation of the width of an electrode and the width of a non-electrode portion, achieving nondestructive evaluation. This makes it possible to estimate the maximum displacement location and the maximum displacement of the piezoelectric element. Thus, if the piezoelectric element is used for an inkjet and so on, the piezoelectric element can be screened by these values. This makes it possible to suppress variations in droplet among ink-jet heads, achieving a coating with high accuracy.

Moreover, external electrodes can be removed only from one surface. The piezoelectric element can be connected to a substrate having many external electrodes.

The piezoelectric element obtained thus is applied to an ink-jet head, achieving a precise coating with small variations in droplet among ink-jet heads.

DESCRIPTION OF EMBODIMENTS

Figure 1:
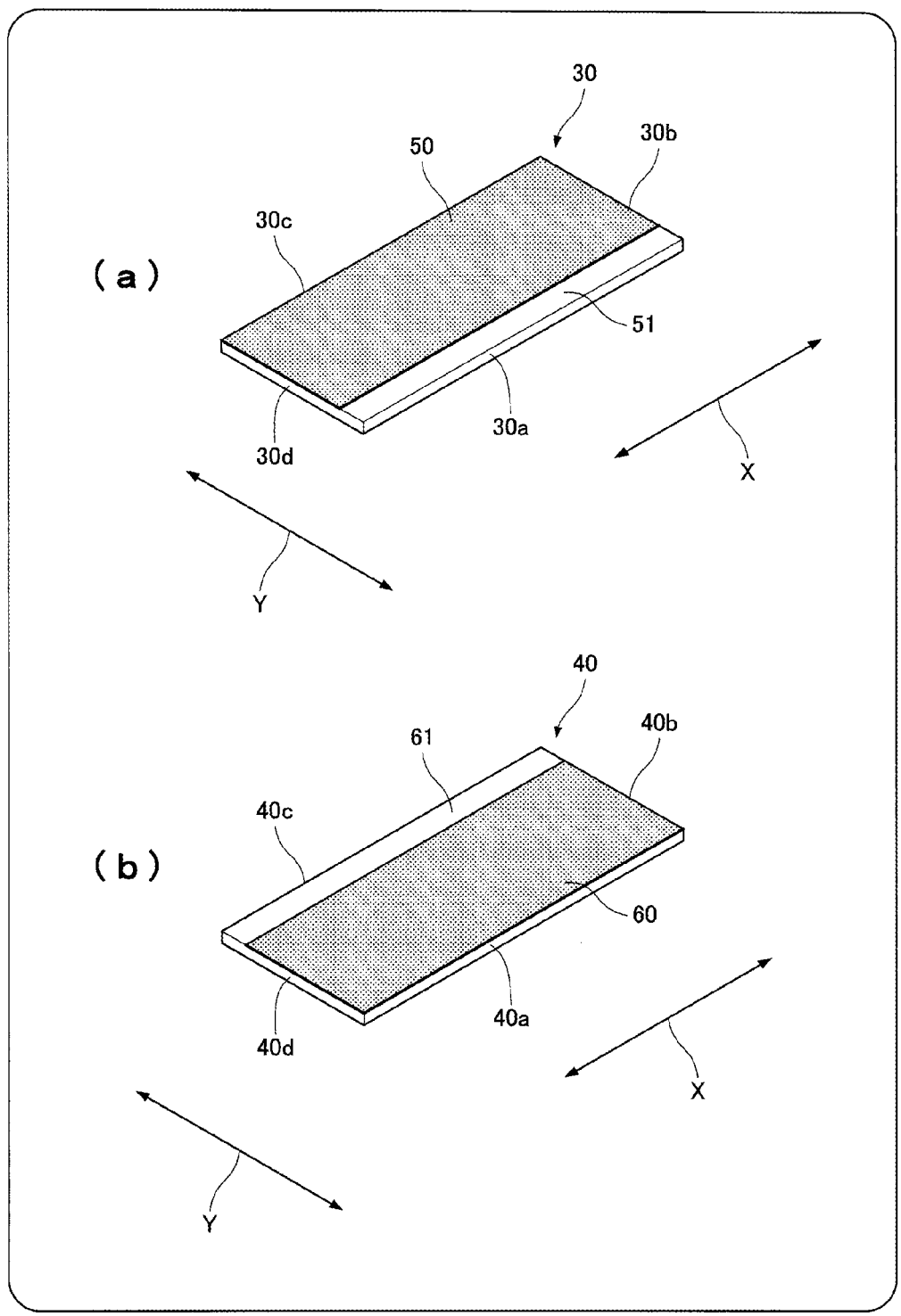
FIG. 1(a) is a plan view of a first sheet used for a piezoelectric element according to a first embodiment of the present invention.
FIG. 1(b) is a plan view of a second sheet.

Referring to FIGS. 1 to 6, embodiments of the present invention will be described below.

First Embodiment

FIGS. 1 to 4 show a first embodiment of the present invention.

FIGS. 1(a) and 1(b) are enlarged perspective views of a first sheet 30 and a second sheet 40 that are used for a piezoelectric element of the present invention. Reference character X denotes a lengthwise direction.

The first sheet 30 with a rectangular principal surface has a first long side 30a and a second long side 30c that are opposed to each other in a widthwise direction Y and a first short side 30b and a second short side 30d that are opposed to each other in the lengthwise direction X. On the principal surface of the first sheet 30, a first electrode 50 is formed from the second long side 30c toward the first long side 30a so as to reach two ends of the first short side 30b and the second short side 30d. A first non-electrode region 51 containing no electrodes is formed from the first long side 30a toward the second long side 30c so as to reach the ends of the first short side 30b and the second short side 30d.

The second sheet 40, which is a rectangular sheet with a rectangular principal surface, has a third long side 40a and a fourth long side 40c that are opposed to each other in the widthwise direction Y and a third short side 40*b* and a fourth short side 40*d* that are opposed to each other in the lengthwise direction X. On the principal surface of the second sheet 40, a second electrode 60 is formed from the third long side 40*a* toward the fourth long side 40*c* so as to reach two ends of the third short side 40*b* and the fourth short side 40*d*. A second non-electrode region 61 containing no electrodes is formed from the fourth long side 40*c* toward the third long side 40*a* so as to reach the ends of the third short side 40*b* and the fourth short side 40*d*.

The first and second sheets 30 and 40 having the same thickness can minimize a distortion occurring during burning. Each of the sheets is desirably 5 μm to 100 μm in thickness, more desirably 10 μm to 50 μm in thickness.

Figure 2:
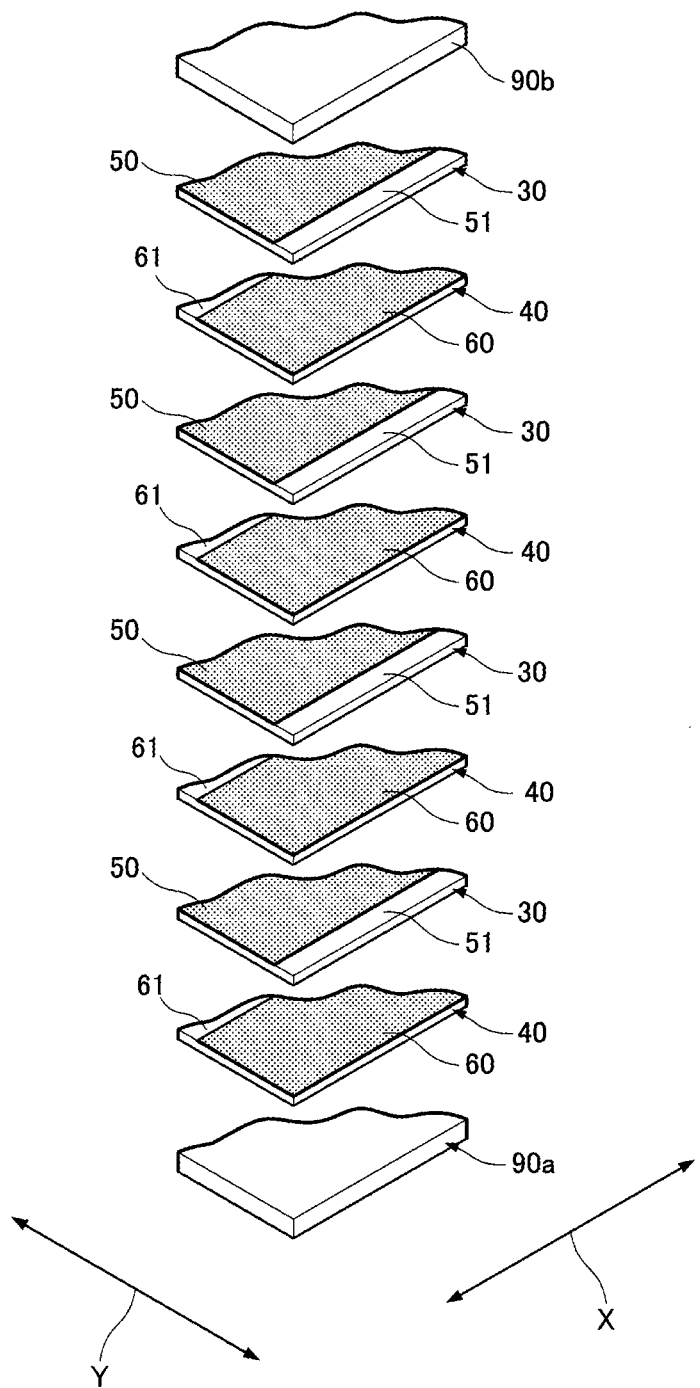
FIG. 2 is an exploded view of a principal part in a stacked state of the first and second sheets.
Figure 3:
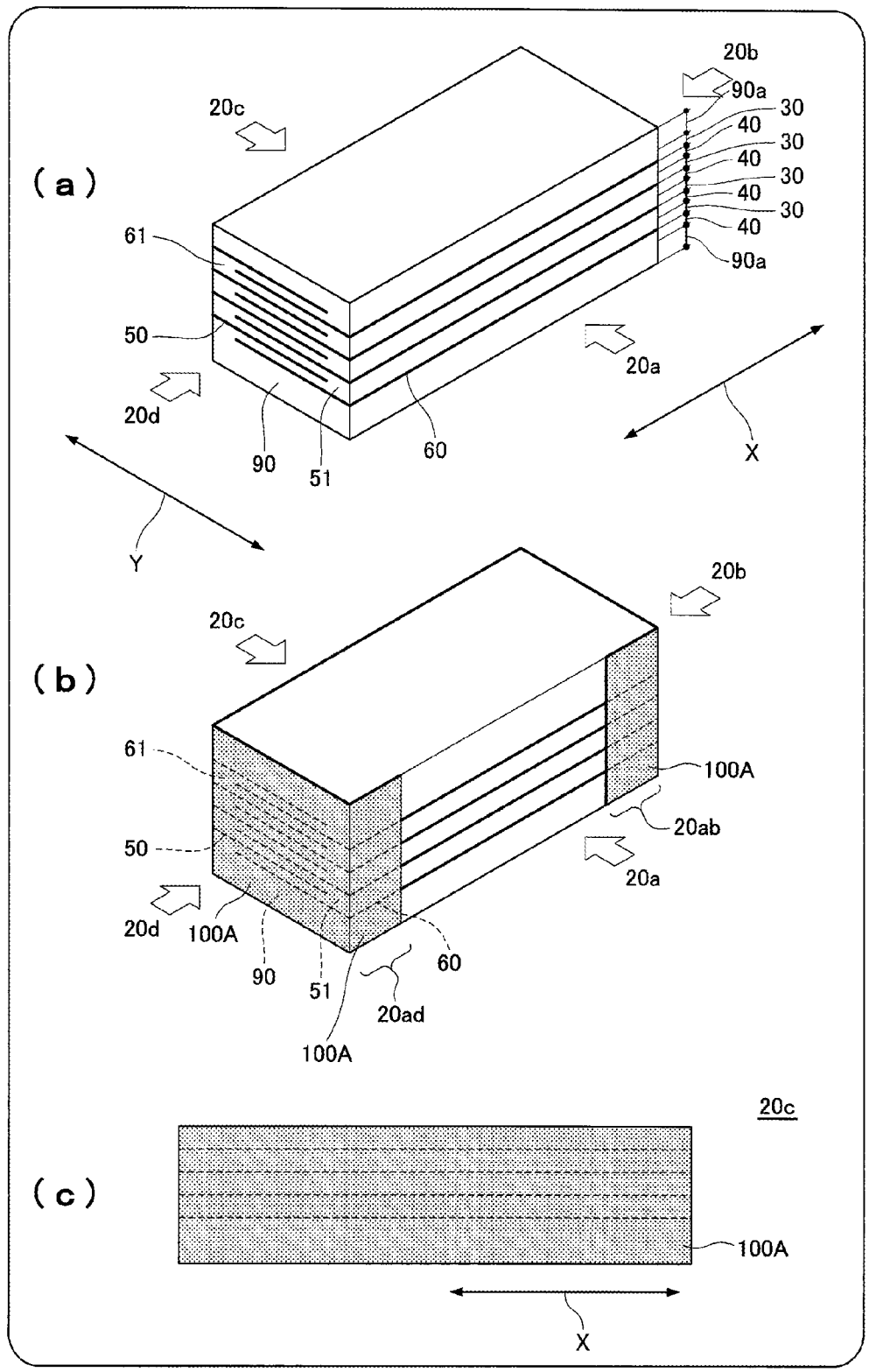
FIG. 3(a) is a perspective view of a block before a conductive film is formed.
FIG. 3(b) is a perspective view of the block after the conductive film is formed.
FIG. 3(c) is a rear view of the block after the conductive film is formed.

As shown in FIG. 2, the first and second sheets 30 and 40 are alternately stacked on a lower part 90*a* and then are pressed and sintered thereon so as to obtain a block shown in FIG. 3(*a*).

The sintered first non-electrode region 51 and second non-electrode region 61 can be nondestructively observed from a left lateral surface 20*d* and a right lateral surface 20*b*. The first electrode 50 and the second electrode 60 can be also observed. The sintered first electrode 50 can be nondestructively observed from a rear surface 20*c* of the block. The sintered second electrode 60 can be nondestructively observed from a front surface 20*a* of the block.

The ceramic green sheet containing no electrodes may be used as the lower part 90*a* or an upper part 90*b*.

As shown in FIG. 3(*c*), a conductive film 100A is formed on the rear surface 20*c* of the block shown in FIG. 3(*a*). As shown in FIG. 3(*b*), the conductive film 100A is formed through the right lateral surface 20*b* to an end 20*ab* of the front surface 20*a* of the block, near the right lateral surface 20*b*. Furthermore, the conductive film 100A is formed through the left lateral surface 20*d* to an end 20*ad* of the front surface 20*a* of the block, near the left lateral surface 20*d*.

Figure 4:
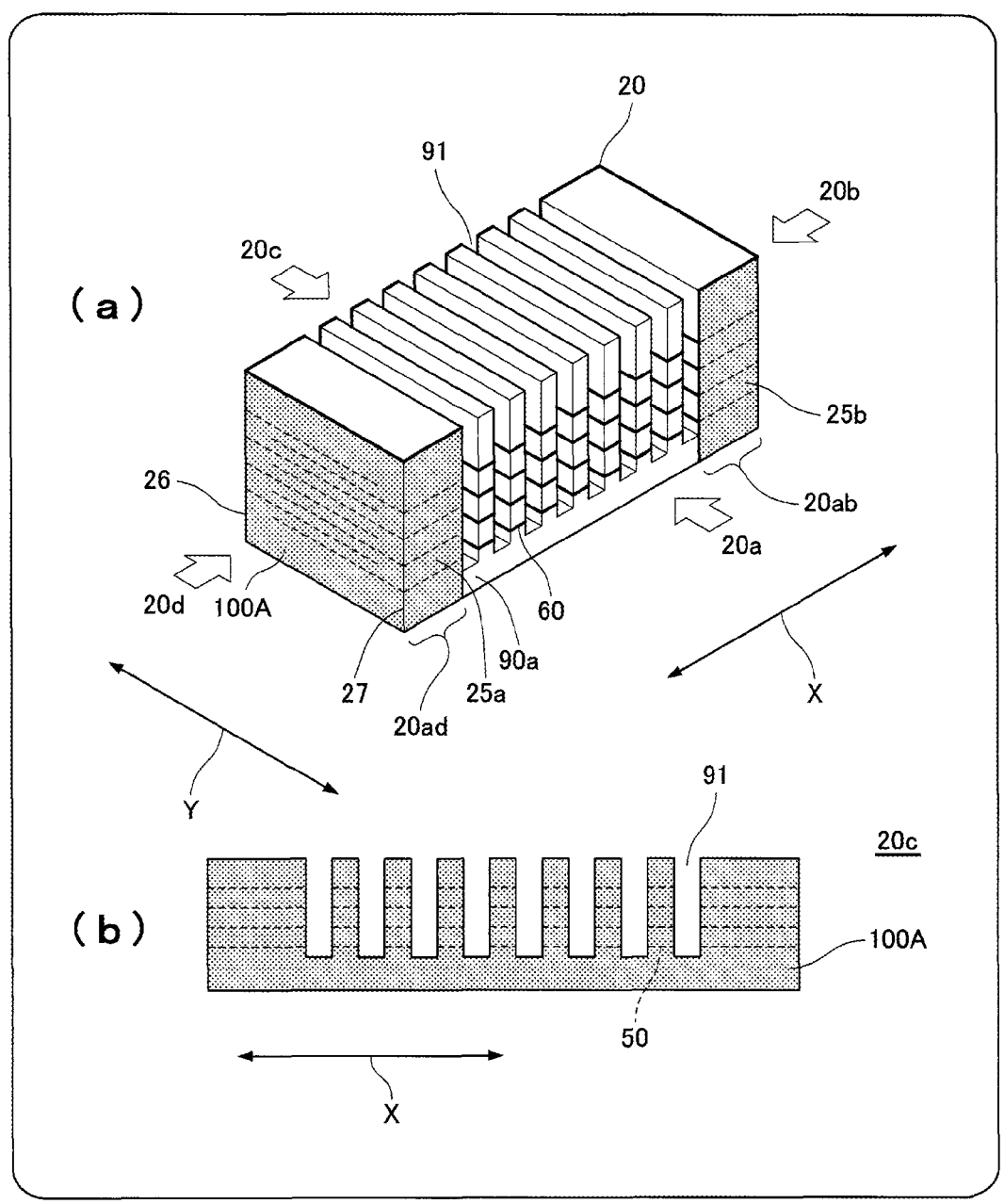
FIG. 4(a) is a perspective view of a completed product including a plurality of slits formed on the block having the conductive film.
FIG. 4(b) is a rear view of the block.

As described earlier, on the block serving as an intermediate product having the conductive film 100A, as shown in FIG. 4(*a*), slits 91 formed in the stacking direction of the first and second sheets 30 and 40 are spaced at predetermined intervals in the lengthwise direction X, completing the piezoelectric element. FIG. 4(*b*) shows the rear surface of the completed piezoelectric element.

With this configuration, the first electrodes 50 exposed on the second long sides 30*c* of the first sheets 30 are connected via the conductive film 100A formed on the rear surface 20*c*, the conductive film 100A is drawn through the right lateral surface 20*b* to the end 20*ab* of the front surface 20*a* of the block, near the right lateral surface 20*b*, and the conductive film 100A is drawn through the left lateral surface 20*d* to the end 20*ad* of the front surface 20*a*, near the left lateral surface 20*d*. Thus, an external electrode is brought into contact with one of the end 20*ab* and the end 20*ad* of the front surface 20*a* of the block and the second electrodes 60 exposed on the front surface 20*a* of the block, thereby driving the piezoelectric element through connection from the front surface 20*a* of the block.

With this configuration, before the conductive film 100A is formed, the end faces of the first electrodes 50 and the end faces of the second electrodes 60 are exposed on both of the left lateral surface 20*d* and the right lateral surface 20*b* of the block as shown in FIG. 3(*a*). Thus, the width of the first non-electrode region 51 and the width of the second non-electrode region 61 can be nondestructively observed. This can inspect the location of a maximum displacement and a maximum displacement of the piezoelectric element.

Thus, if the piezoelectric element is used for inkjet and so on, the piezoelectric element can be screened by the inspection. This can suppress variations in ink-jet droplet, achieving a coating with high accuracy.

If the conductive film 100A is drawn to the front surface 20*a* via the right lateral surface 20*b* and the left lateral surface 20*d*, the conductive film 100A is likely to fall at a corner 26 of the rear surface 20*c* and the left lateral surface 20*d* and a corner 27 of the left lateral surface 20*d* and the front surface 20*a*.

In the present embodiment, however, the first electrode 50 connected to the conductive film 100A of the rear surface 20*c* is exposed on the end face of the left lateral surface 20*d* while the second electrode 60 connected to the conductive film 100A of the front surface 20*c* is exposed on the end face of the left lateral surface 20*d*. Thus, even if the conductive film 100A falls at the corners 26 and 27, the first electrodes 50 and the second electrodes 60 that are exposed on the end face of the left lateral surface 20*d* are short-circuited by the conductive film 100A formed on the left lateral surface 20*d* and thus faulty connection does not occur between the conductive film 100A on the rear surface 20*c* and the conductive film 100A on the front surface 20*a*. The electrodes are similarly exposed on the right lateral surface 20*b*.

In the present embodiment, the conductive film 100A is formed on the right lateral surface 20*b* and the left lateral surface 20*d* of the block serving as an intermediate product, and the conductive film 100A is drawn to the end 20*ab* near the right lateral surface 20*b* and the end 20*ad* near the left lateral surface 20*d*. The conductive film 100A may be formed on one of the lateral surfaces. Specifically, if the conductive film 100A is not formed on the right lateral surface 20*b* of the block, the conductive film 100A of the rear surface 20*c* is drawn to the end 20*ad* through the conductive film 100A formed on the left lateral surface 20*d*. In this case, the conductive film 100A is not provided on the end 20*ab* near the right lateral surface 20*b*.

Second Embodiment

Figure 5:
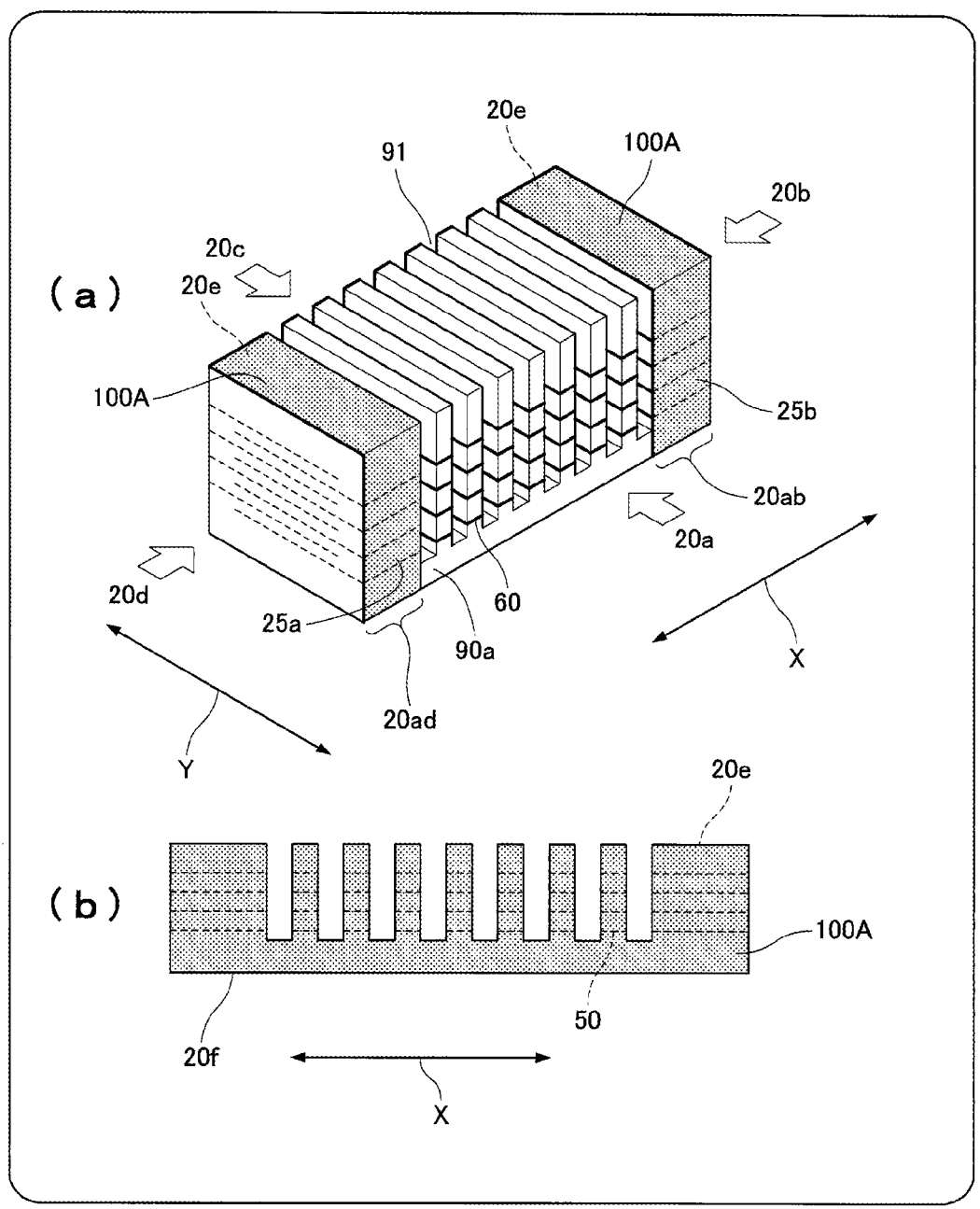
FIG. 5(a) is a perspective view of a piezoelectric element according to a second embodiment of the present invention.
FIG. 5(b) is a rear view of the piezoelectric element.
Figure 6:
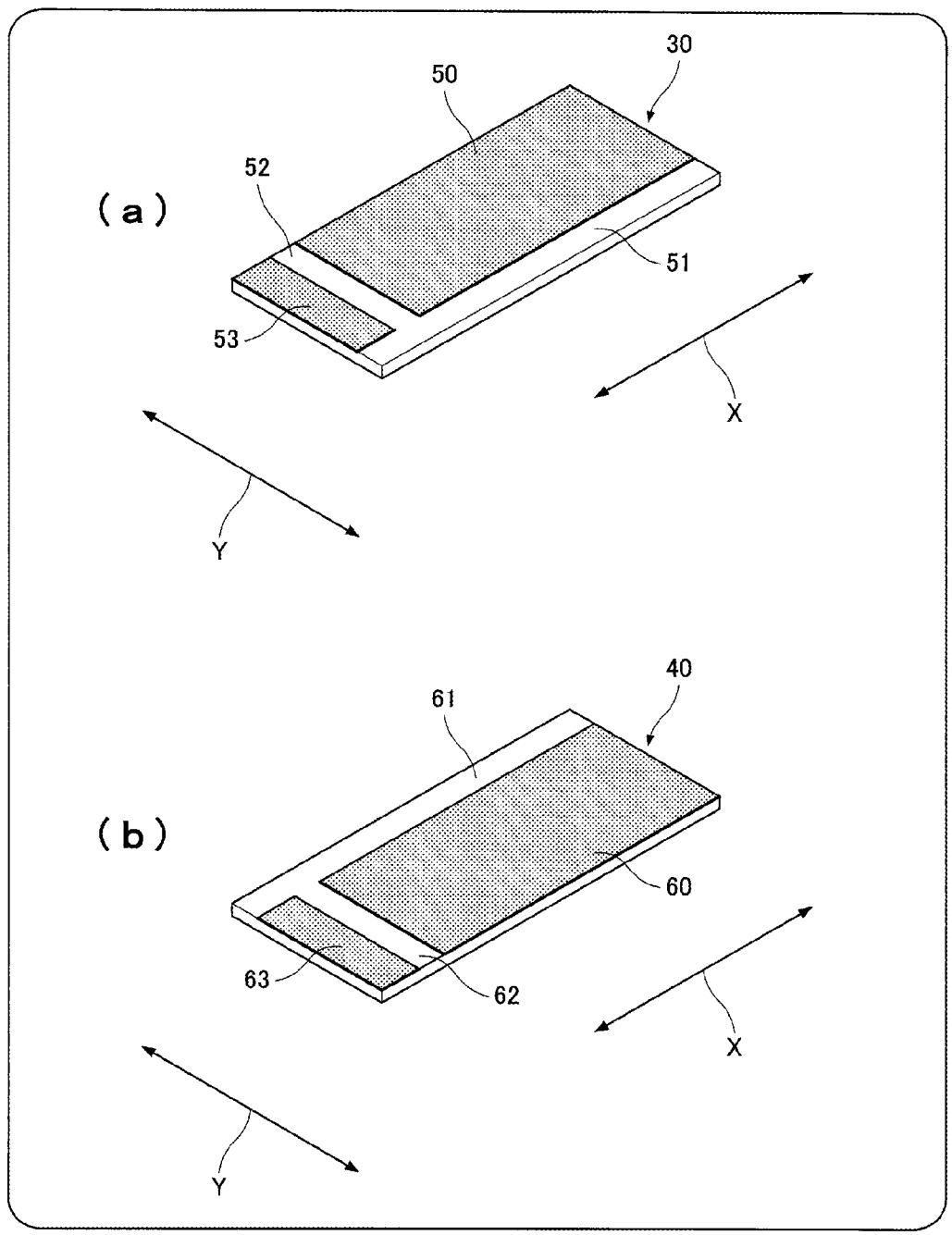
FIG. 6(a) is a plan view of a first sheet used for a piezoelectric element according to a third embodiment of the present invention.
FIG. 6(b) is a plan view of a second sheet.
Figure 7:
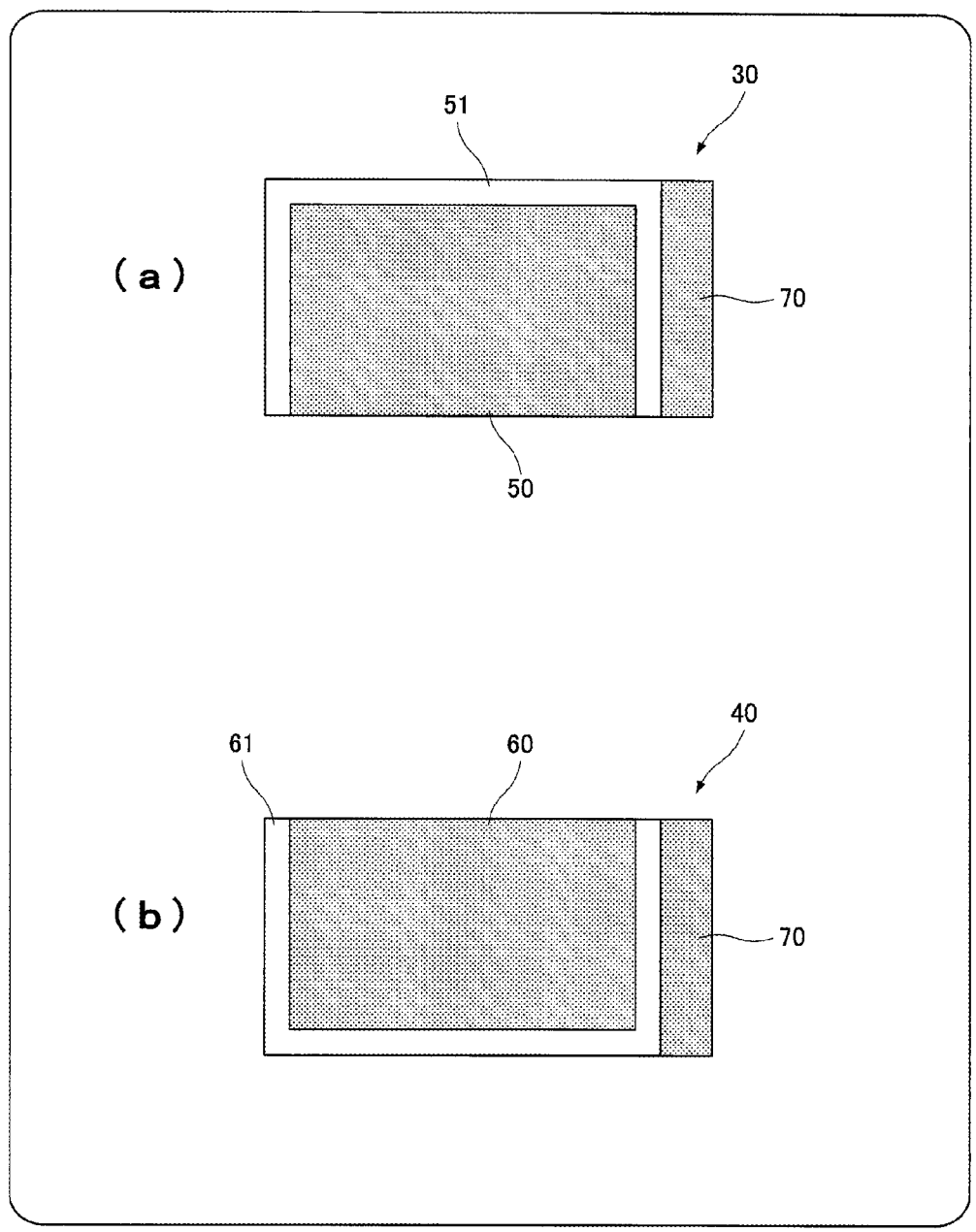
FIG. 7(a) is a plan view of a first sheet used for a conventional piezoelectric element.
FIG. 7(b) is a plan view of a second sheet.
Figure 8:
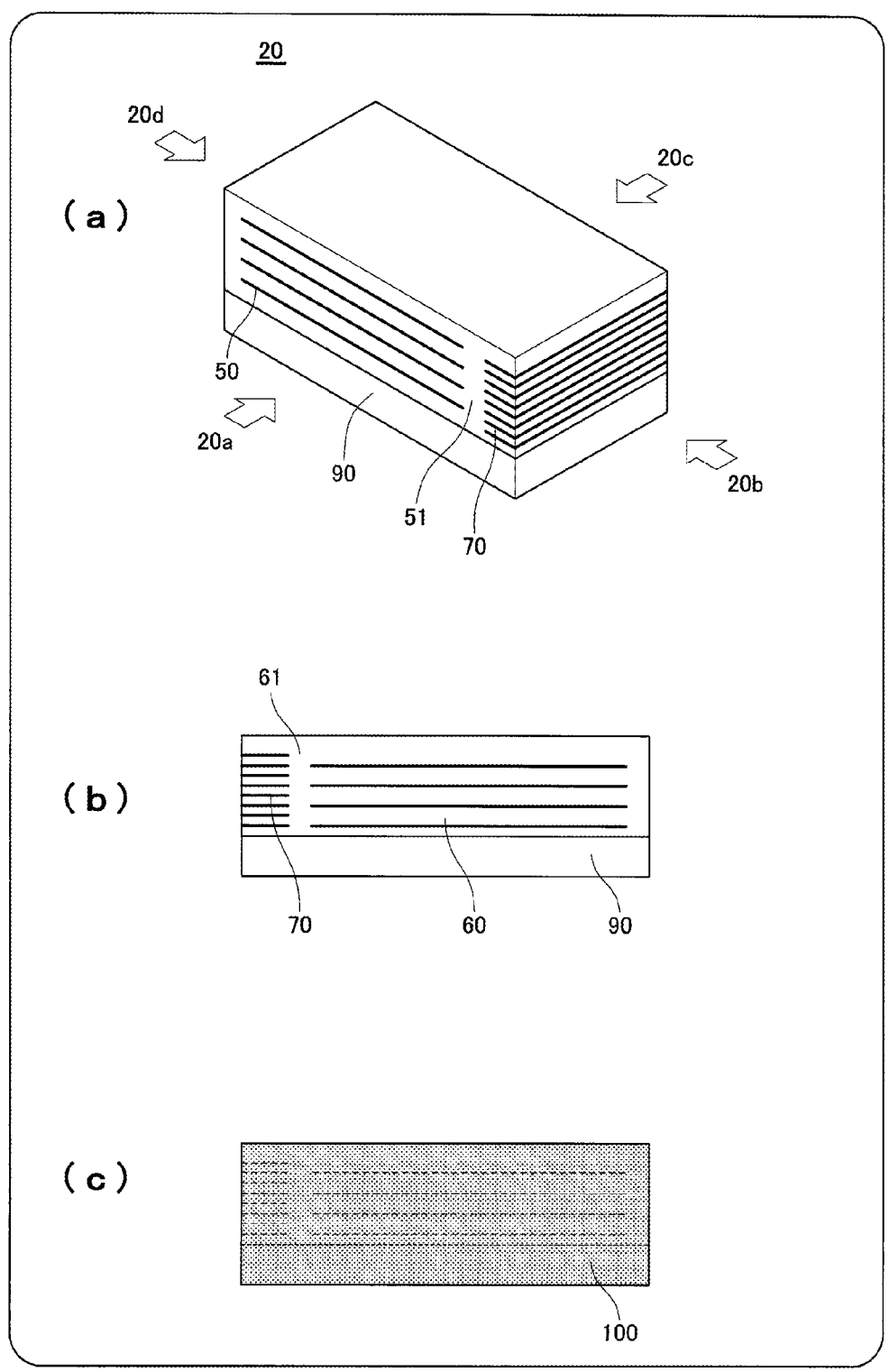
FIG. 8(a) is a perspective view of a block that is a conventional intermediate product before a conductive film is formed.
FIG. 8(b) is a rear view of the block.
FIG. 8(c) is a rear view of the block having the conductive film.
Figure 9:
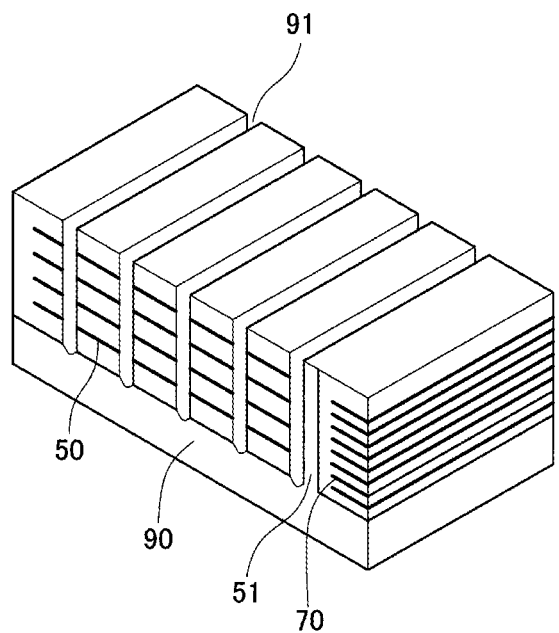
FIG. 9 is a perspective view of the conventional piezoelectric element including a plurality of slits formed on the block having the conductive film.
Figure 10:
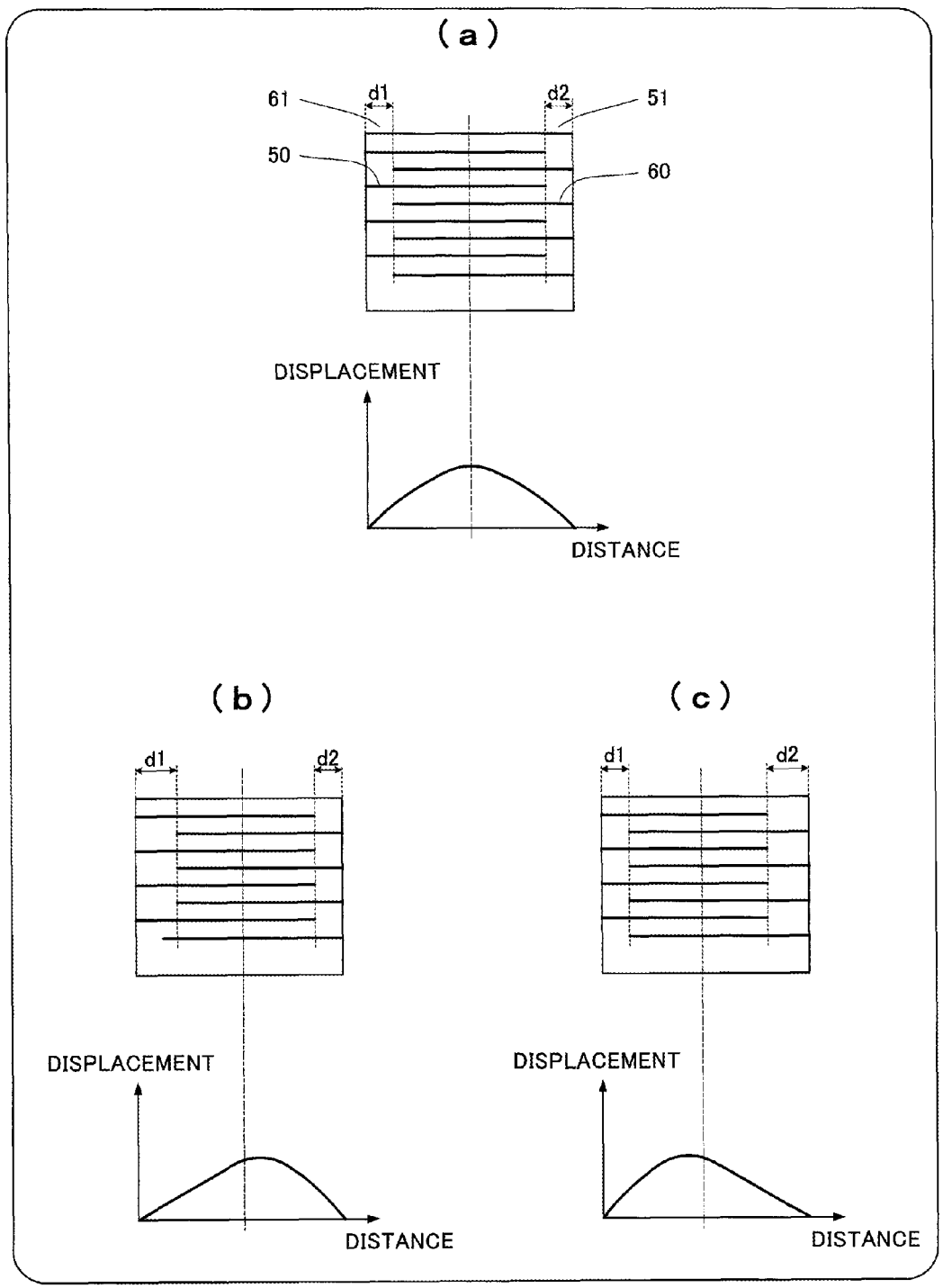
FIGS. 10(a) to 10(c) are graphs showing the non-electrode regions and the displacements of the conventional piezoelectric element.

FIG. 5 shows a second embodiment of the present invention.

In the first embodiment, the conductive film 100A of the rear surface 20*c* is drawn to the front surface 20*a* through at least one of the right lateral surface 20*b* and the left lateral surface 20*d*, whereas in the second embodiment shown in FIG. 5, a conductive film 100A formed on a rear surface 20*c* as shown in FIG. 5(*b*) may be drawn to an end 20*ab* near a right lateral surface 20*b* of a block, which is an intermediate product, and an end 20*ad* near a left lateral surface 20*d* through the conductive film 100A formed on a top surface 20*e* as shown in FIG. 5(*a*). Other configurations are identical to the configurations of the first embodiment.

In the second embodiment, the conductive film 100A of the rear surface 20*c* is drawn to a front surface 20*a* through the conductive film 100A formed on the top surface 20*e*. If the configuration needs to respond to a large driving current, as in the first embodiment, the conductive film 100A of the rear surface 20*c* may be drawn to the front surface 20*a* through at least one of the right lateral surface 20*b* and the left lateral surface 20*d*, and the conductive film 100A of the rear surface 20*c* may be drawn to the front surface 20*a* through the conductive film 100A formed on the top surface 20*e*.

Moreover, the conductive film 100A of the rear surface 20*c* is drawn to the front surface 20*a* through the conductive film 100A formed on the top surface 20*e*. The conductive film 100A of the rear surface 20*c* may be drawn to the front surface 20a through a conductive film (not shown) formed on a bottom surface 20f of the block serving as an intermediate product, instead of the conductive film 100A formed on the top surface 20e. If the configuration needs to respond to a large driving current, as in the first embodiment, the conductive film 100A of the rear surface 20c may be drawn to the front surface 20a through at least one of the right lateral surface 20b and the left lateral surface 20d, and the conductive film 100A of the rear surface 20c may be drawn to the front surface 20a through the conductive film formed on the bottom surface 20f. Furthermore, the conductive film 100A of the rear surface 20c may be drawn to the front surface 20a through at least one of the right lateral surface 20b and the left lateral surface 20d, and the conductive film 100A of the rear surface 20c may be drawn to the front surface through the conductive film formed on the top surface 20e and the bottom surface 20f of the block serving as an intermediate product.

In the earlier explanation, the conductive film 100A formed on the rear surface 20c is drawn to both of the end 20ab near the right lateral surface 20b and the end 20ad near the left lateral surface 20d. The conductive film 100A formed on the rear surface 20c may be drawn to only one of the end 20ab and the end 20ad.

In the foregoing embodiments, the first electrode 50 of the first sheet 30 is formed up to the first short side 30b and the second short side 30d. The first electrode 50 may be formed up to the end of at least one of the first short side 30b and the second short side 30d. Similarly, the first electrode 60 of the second sheet 40 is formed up to the third short side 40b and the fourth short side 40d. The first electrode 60 may be formed up to the end of at least one of the third short side 40b and the fourth short side 40d.

In the foregoing embodiments, the conductive film 100A is formed over the right lateral surface 20b and the left lateral surface 20d. The conductive film 100A does not need to be formed over the right lateral surface 20b and the left lateral surface 20d as long as the conductive film is so wide as to short-circuit the first and second electrodes 50 and 60 exposed on the right lateral surface 20b and the left lateral surface 20d.

Third Embodiment

FIG. 6(a) is a plan view of a first sheet 30 used for a piezoelectric element according to a third embodiment. FIG. 6(b) is a plan view of a second sheet 40 used for the piezoelectric element according to the third embodiment.

In the first embodiment, the first sheet 30 and the second sheet 40 in FIG. 1 are stacked, pressed, and burned. In the third embodiment, the first sheet 30 and the second sheet 40 in FIGS. 6(a) and 6(b) are stacked, pressed, and burned to form the piezoelectric element.

The first sheet 30 in FIGS. 6(a) and 6(b) includes a first electrode 50, a first non-electrode region 51, a third non-electrode region 52, and a third electrode 53. The second sheet 40 includes a second electrode 60, a second non-electrode region 61, a fourth non-electrode region 62, and a fourth electrode 63. Other configurations are similar to the configurations of the first embodiment.

The third embodiment is different from the first embodiment in that the third non-electrode region 52 is provided to separate the third electrode 53 from the first electrode 50 while the fourth non-electrode region 62 is provided to separate the fourth electrode 63 from the second electrode 60.

In a completed piezoelectric element, the third electrode 53 and the fourth electrode 63 are internal electrodes at a left corner 25a near the left lateral surface 20d of the front surface 20c in FIG. 4 or internal electrodes at a left corner 25b near the right lateral surface 20b of the front surface 20c.

In the block-type piezoelectric element including the first sheets 30 and the second sheets 40 that are stacked, pressed, and burned, a slit 91 is located in the third non-electrode region 52 and the fourth non-electrode region 62. The provided third non-electrode region 52 and fourth non-electrode region 62 increase an insulation distance so as to improve insulation.

In this example, the third non-electrode region 52 reaches the first non-electrode region 51 from middle one of the three sides of the first sheet 30. The fourth non-electrode region 62 does not contain an electrode reaching the second non-electrode region 61 from middle one of the three sides of the second sheet 40.

The piezoelectric element can be used for a piezo ink-jet device. The piezoelectric element is attached to a thin tube filled with ink, and then a voltage is applied to the piezoelectric element so as to deform the piezoelectric element, ejecting ink out of the tube. The piezoelectric element can be used for producing a liquid crystal color filter and EL. The ink contains color components.

In the first to third embodiments, the block as an intermediate product and the piezoelectric element as a completed product are not limited to square poles.

INDUSTRIAL APPLICABILITY

The present invention is applicable to a piezoelectric element. The piezoelectric element is applicable to an ink-jet device.

REFERENCE SIGNS LIST 20a front surface
20b right lateral surface
20c rear surface
20d left lateral surface
30 first sheet
30a first long side
30b first short side
30c second long side
30d second short side
40 second sheet
40a third long side
40b third short side
40c fourth long side
40d fourth short side
50 first electrode
51 first non-electrode region
52 third non-electrode region
53 third electrode
60 second electrode
61 second non-electrode region
62 fourth non-electrode region
63 fourth electrode
X lengthwise direction
Y widthwise direction

The invention claimed is:

1. A piezoelectric element that is a block of a rectangular solid, the block comprising:
a first sheet with a rectangular principal surface having a first short side, a second short side, a first long side, and a second long side, the principal surface including a first electrode formed in a rectangular shape and formed up to at least only a part of the first short side and up to only the second long side; and a second sheet with a rectangular principal surface having a third short side, a fourth short side, a third long side, and a fourth long side, the principal surface including a second electrode formed in a rectangular shape and formed up to at least only a part of the third short side and up to only the third long side, a plurality of the first and second sheets being stacked such that the first long side and the third long side are aligned with each other and the first short side and the third short side are aligned with each other with the principal surfaces placed face up or face down, a first long side of the block being defined by the first long sides of the first sheets and the third long sides of the second sheets with a second long side of the block being opposite the first long side of the block, a first short side of the block being defined by the first short sides of the first sheet and the third short sides of the second sheet with a second short side of the block being opposite the first short side of the block, the block further comprising:

a plurality of slits that are formed perpendicularly to the first long side and are spaced at predetermined intervals along the first long side of the block; and a conductive film electrically connecting:

a surface including the second long side of the block;

at least one of two ends along the first long side of the block on a surface including the first long side of the block; and a surface including the first short side of the block, wherein at least one of the first electrodes formed up to the first short sides of the first sheets and at least one of the second electrodes formed up to the third short sides of the second sheets are electrically connected with each other by the conductive film.

2. The piezoelectric element according to claim 1, wherein the first electrode is formed over the second long side but is not formed over the first long side, and the second electrode is formed over the third long side but is not formed over the fourth long side.

3. The piezoelectric element according to claim 1, wherein at least one of the first electrodes is formed up to two ends of the first short side and the second short side of the first sheet, at least one of the second electrodes is formed up to two ends of the third short side and the fourth short side of the second sheet, and the at least one of the first electrodes formed up to the second short side and the at least one of the second electrodes formed up to the fourth short side are electrically connected with each other by the conductive film.

4. The piezoelectric element according to claim 1, wherein the conductive film is formed on the two ends disposed along the first long side on the surface including the first long side of the block.

5. The piezoelectric element according to claim 1, wherein the first sheet has a third non-electrode region containing no electrodes in order to separate a part of the first electrode into a third electrode, and the second sheet has a fourth non-electrode region containing no electrodes in order to separate a part of the second electrode into a fourth electrode.

6. The piezoelectric element according to claim 5, wherein the third non-electrode region splits the first electrode along the first long side, and the fourth non-electrode region splits the second electrode along the first long side.

7. The piezoelectric element according to claim 6, wherein one of the slits is located in the third non-electrode region and the fourth non-electrode region.

8. An ink jet device that applies ink to an object of application by means of the piezoelectric element according to claim 1.

9. An application method that applies ink to an object of application by means of the piezoelectric element according to claim 1.

10. The piezoelectric element according to claim 1, wherein the first electrode and the second electrode are respectively formed in a rectangular shape that does not include a non-electrode region therein.

11. The piezoelectric element according to claim 1, wherein an uppermost one of the first electrodes in the blocks is above an uppermost one of the second electrodes in the block relative to a direction in which the piezoelectric element displaces.

12. A piezoelectric element that is a block of a rectangular solid, the block comprising:

a first sheet with a rectangular principal surface having a first short side, a second short side, a first long side, and a second long side, the principal surface including a first electrode formed in a rectangular shape and formed up to at least only a part of the first short side and up to only the second long side; and a second sheet with a rectangular principal surface having a third short side, a fourth short side, a third long side, and a fourth long side, the principal surface including a second electrode formed in a rectangular shape and formed up to at least only a part of the third short side and up to only the third long side, a plurality of the first and second sheets being stacked such that the first long side and the third long side are aligned with each other and the first short side and the third short side are aligned with each other with the principal surfaces placed face up or face down, a first long side of the block being defined by the first long sides of the first sheets and the third long sides of the second sheet with a second long side of the block being opposite the first long side of the block, a first short side of the block being defined by the first short sides of the first sheet and the third short sides of the second sheet with a second short side of the block being opposite the first short side of the block, the block further comprising:

a plurality of slits that are formed perpendicularly to the first long side and are spaced at predetermined intervals along the first long side of the block; and a conductive film electrically connecting:

a surface including the second long side of the block;

at least one of two ends along the first long side on a surface including the first long side of the block; and one of a top surface and a bottom of the block, wherein at least one of the first electrodes formed up to the first short sides of the first sheets and at least one of the second electrodes formed up to the third short sides of the second sheets are electrically connected with each other by the conductive film.

* * * * *